US012690469B2

(12) United States Patent
    Ge et al.

(10) Patent No.: US 12,690,469 B2
(45) Date of Patent: Jul. 21, 2026

(54) PACKAGED SEMICONDUCTOR DEVICE, LEADFRAME AND METHOD FOR IMPROVED BONDING

(71) Applicant: NXP USA, INC., Austin, TX (US)

(72) Inventors: You Ge, Tianjin (CN); Zhijie Wang, Tianjin (CN); Yit Meng Lee, Kuala Lumpur (MY); Yanbo Xu, Tianjin (CN)

(73) Assignee: NXP USA, Inc., Austin, TX (US)

( * ) Notice: Subject to any disclaimer, the term of this patent is extended or adjusted under 35 U.S.C. 154(b) by 600 days.

(21) Appl. No.: 17/818,778

(22) Filed: Aug. 10, 2022

(65) Prior Publication Data

US 2023/0068886 A1       Mar. 2, 2023

(30) Foreign Application Priority Data

Aug. 31, 2021    (CN) .......................... 202111013270.2

(51) Int. Cl.
    *H10W 70/40*        (2026.01)
    *H10W 72/00*        (2026.01)
    *H10W 72/30*        (2026.01)
    *H10W 90/00*        (2026.01)

(52) U.S. Cl.
    CPC .... *H10W 70/417* (2026.01); *H10W 72/07332* (2026.01); *H10W 72/354* (2026.01); *H10W 72/884* (2026.01); *H10W 90/736* (2026.01); *H10W 90/756* (2026.01)

(58) Field of Classification Search
    CPC .......................... H01L 23/49503–49513; H01L 21/4821–4842; H01L 23/49861; H01L 23/495–49596; H01L 2924/0665; H01L 2224/2919; H01L 2224/3226; H01L 2224/48245; H01L 2224/73265; H01L 2224/83201; H01L 23/3107; H01L 23/3142; H01L 23/49548; H01L 24/32; H01L 24/29; H01L 24/83; H01L 24/48;
    (Continued)

(56) References Cited

U.S. PATENT DOCUMENTS

| | | | |
|---|---|---|---|
| 4,942,452 | A | 7/1990 | Kitano et al. |
| 5,659,199 | A | 8/1997 | Mori et al. |
| 6,380,048 | B1 | 4/2002 | Boon et al. |
(Continued)

FOREIGN PATENT DOCUMENTS

| | | |
|---|---|---|
| JP | S56104459 A | 8/1981 |
| JP | H02246359 A | 10/1990 |
(Continued)

*Primary Examiner* — Leonard Chang
*Assistant Examiner* — Stanetta D Isaac

(57)        ABSTRACT

There is disclosed a packaged semiconductor device comprising: a leadframe having a first thickness; the leadframe comprising a die pad; a semiconductor die thereabove; and epoxy therebetween and arranged to bond the semiconductor die to the die pad; wherein in at least one region under the semiconductor die, the die pad has a second thickness less than the first thickness; wherein the die pad has at least one through-hole in the at least one region; and wherein the epoxy fills the at least one through-hole and extends thereunder and laterally beyond the through-hole. Corresponding leadframes, and an associated method of manufacture are also disclosed.

20 Claims, 6 Drawing Sheets

200

(58) Field of Classification Search
    CPC ............. H10W 70/417; H10W 70/411; H10W
                    70/424; H10W 74/111; H10W 74/127
    See application file for complete search history.

(56) References Cited

U.S. PATENT DOCUMENTS

| | | | | |
|---|---|---|---|---|
| 6,965,157 | B1 | 11/2005 | Perez et al. | |
| 7,808,089 | B2 | 10/2010 | Nguyen et al. | |
| 7,977,773 | B1 | 7/2011 | Cusack | |
| 9,601,414 | B2 | 3/2017 | Zhang et al. | |
| 10,497,643 | B1 | 12/2019 | Gurrum et al. | |
| 2002/0096790 | A1* | 7/2002 | Kasuya ............. | H01L 23/49503 |
| | | | | 257/E23.037 |
| 2003/0141575 | A1* | 7/2003 | Yu ........................... | H01L 24/83 |
| | | | | 257/E23.04 |
| 2011/0193208 | A1* | 8/2011 | Xue ........................ | H01L 24/83 |
| | | | | 257/676 |
| 2015/0162260 | A1* | 6/2015 | Liao .................. | H01L 23/49568 |
| | | | | 257/675 |
| 2019/0206772 | A1 | 7/2019 | How et al. | |
| 2020/0194357 | A1* | 6/2020 | Shibuya ............ | H01L 23/49524 |
| 2021/0217686 | A1 | 7/2021 | Bin Hud et al. | |

FOREIGN PATENT DOCUMENTS

| | | |
|---|---|---|
| JP | H053280 A | 1/1993 |
| TW | I376019 B | 11/2012 |

* cited by examiner

FIG. 1

<u>610</u>
provide a lead frame having
a first thickness

<u>620</u>
provide a semiconductor
die

<u>630</u>
bonding the semiconductor
die to the die-pad using an
epoxy

PACKAGED SEMICONDUCTOR DEVICE, LEADFRAME AND METHOD FOR IMPROVED BONDING

CROSS-REFERENCE TO RELATED APPLICATIONS

This application claims the priority under 35 U.S.C. § 119 of China application no. 202111013270.2, filed on 31 Aug. 2021, the contents of which are incorporated by reference herein.

FIELD

The present disclosure relates to packaged semiconductor devices, leadframes therefor, and methods of manufacturing the same.

BACKGROUND

Delamination between the components of a packaged semiconductor device is and always has been of concern and a potential failure mode of the device. For devices for which the packaging process includes bonding the semiconductor die or chip on to the die pad or die paddle of a leadframe, such as is the case in "no lead" packages such as quad flat no lead ("QFN") and quad flat package ("QFP") packages, one of the interfaces which may be the cause of delamination is that between the die pad and the epoxy used to bond the semiconductor die to the die pad.

Different epoxies are used for different packages and applications. For applications in which a high thermal conductance is required through the epoxy in order to conduct away heat from the chip, it is known to use metal-loaded epoxy—that is to say epoxy which has metal particles embedded in the epoxy matrix. By appropriate choice of metal—typically silver—such metal-loaded epoxy can provide a high thermal conductivity relative to other types of epoxy. However, these types of epoxy also generally exhibit lower adhesion to the die pad, which in turns increases the risk of delamination.

One way of mitigating this risk is to roughen the surface of the die pad, thereby improving the adhesion. However, the roughening process adds to the cost of the leadframe; it would be desirable provide alternative means of reducing the risk of delamination.

SUMMARY

According to a first aspect of the present measure, there is provided a packaged semiconductor device comprising: a leadframe having a first thickness; the leadframe comprising a die pad; a semiconductor die thereabove; and epoxy therebetween and arranged to bond the semiconductor die to the die pad; wherein in at least one region under the semiconductor die, the die pad has a second thickness less than the first thickness; wherein the die pad has at least one through-hole in the at least one region; and wherein the epoxy fills the at least one through-hole and extends thereunder and laterally beyond the through-hole. By extending laterally beyond the through-hole, the epoxy forms a plug or nail with a head. The head of the epoxy plug or nail may lock the epoxy layer to the die pad, thereby reducing the risk of delamination and improving the adhesion between the parts.

In one or more embodiments, the epoxy has a high thermal conductivity, such as at least 10 W/m·K. Metal-loaded epoxy may be particularly suited for high-power or high-temperature applications by providing a high conductance thermal path to cool the semiconductor die.

In one or more embodiments, the at least one region comprises a network of elongate channels or trenches. The network of elongate channels in such embodiments may extend radially from a hub. There thereby may be formed a single region of reduced thickness, which may be beneficial for avoiding trapping air or creating a void, during later processing.

In one or more embodiments, the at least one region extends laterally beyond the semiconductor die. However, preferably the at least one region does not extend to the perimeter of the die pad, thereby preventing seeping of encapsulant material into the region during later encapsulation.

In one or more embodiments, the leadframe further comprises a plurality of leads, electrically isolated from the die pad. The packaged semiconductor device may further comprise a moulding compound encapsulating the semiconductor die. The packaged semiconductor device may be configured as a quad-flat-no-lead, QFN, package or as a quad flat package, QFP.

In one or more embodiments the second thickness is within a range of 40% to 60% of the first thickness. Such a range of thickness may provide a good compromise between strength of the die pad and space for the epoxy to exude beyond the through-holes into the reduced thickness region.

According to a second aspect of the present disclosure there is provided a leadframe for use in a packaged semiconductor device as discussed above, the leadframe have a first thickness and comprising a die pad; wherein in at least one region, the die pad has a second thickness which is less than the first thickness; and wherein the die pad has at least one through-hole in the at least one region. When compared to a leadframe with a roughened surface, the leadframe may have reduced manufacturing cost.

The at least one region may comprise a network of elongate channels, and the network of elongate channels may extend radially from a hub.

According to a further aspect of the present disclosure, there is provided a method of manufacturing a packaged semiconductor device, the method comprising: providing a leadframe having a first thickness; the leadframe comprising a die pad, wherein in at least one region, the die pad has a second thickness less than the first thickness, and wherein the die pad has at least one through-hole in the at least one region; providing semiconductor die; and bonding the semiconductor die to the die pad using an epoxy, such that the epoxy fills the at least one through-hole and extends thereunder and laterally beyond the through-hole.

The method may further comprise encapsulating the semiconductor die with a moulding compound, wherein a surface of the regions of the die pad having the second thickness remains exposed.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which FIG. 1 shows a cross-section through a conventional packaged semiconductor device;

Figure 2:
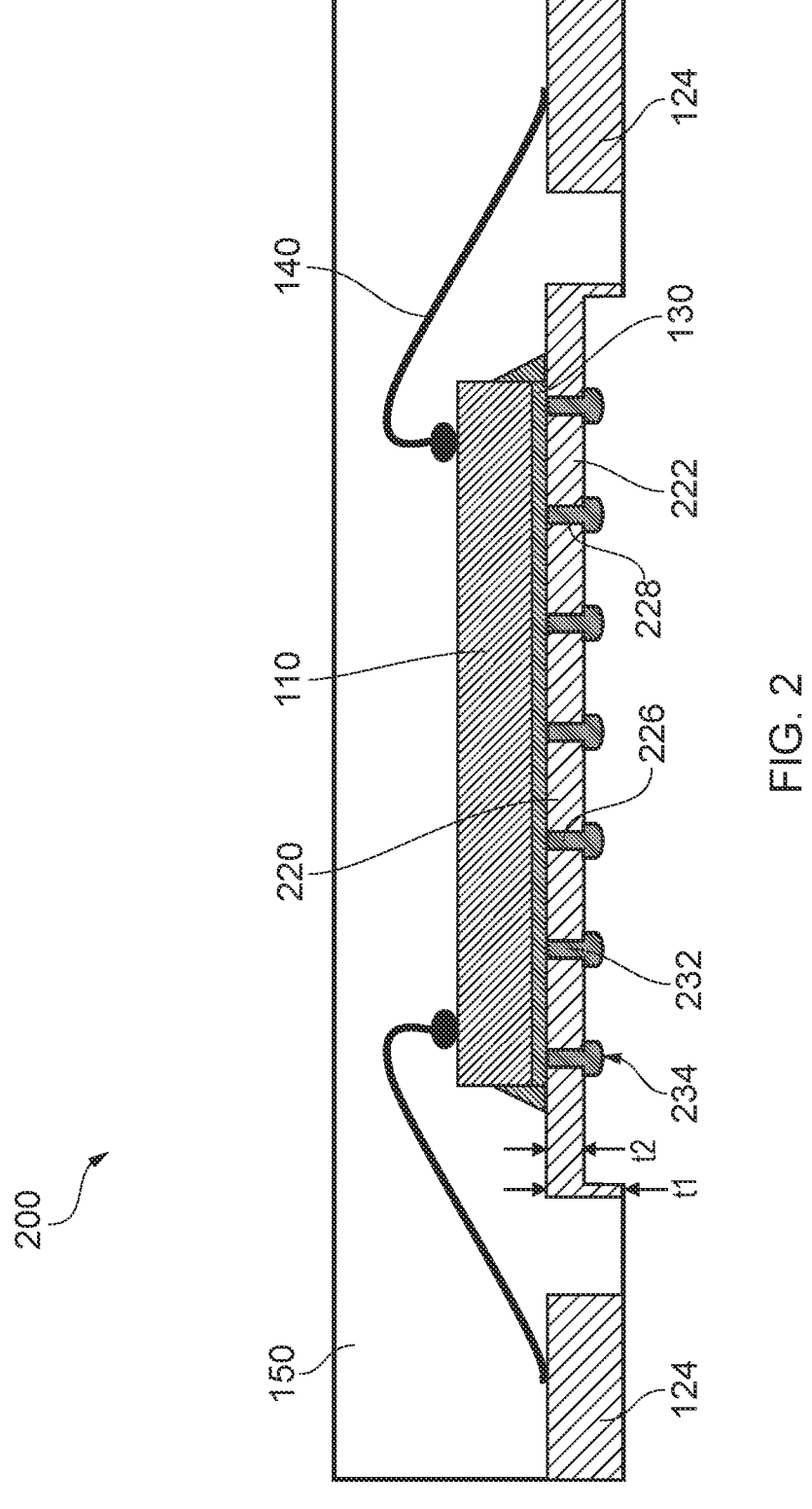
FIG. 2 shows a cross-section through a packaged semiconductor device according to the present disclosure.

It should be noted that the FIGURES are diagrammatic and not drawn to scale. Relative dimensions and proportions of parts of these FIGURES have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

Figure 1:
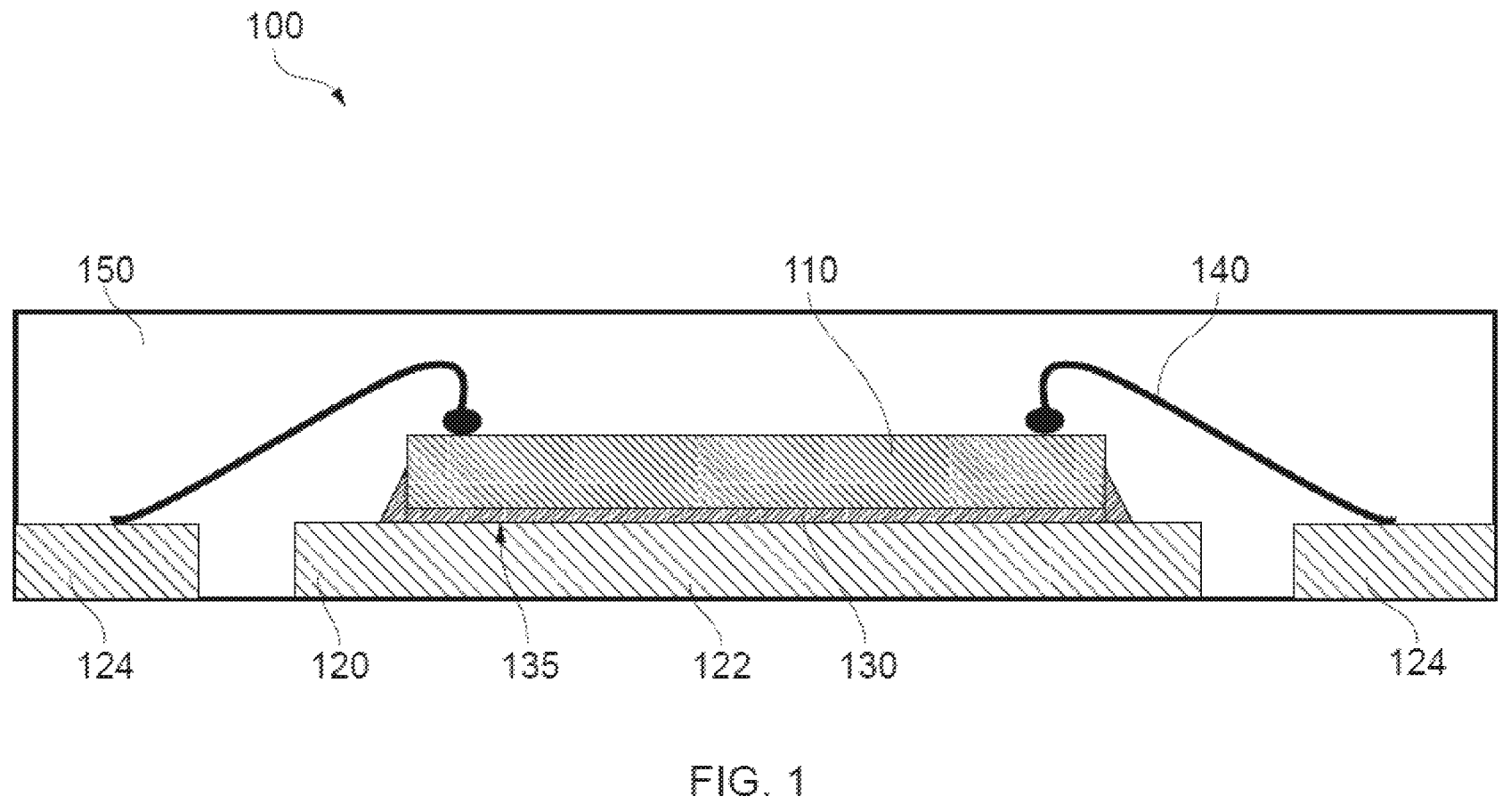

FIG. 1 shows a schematic section through a conventional packaged semiconductor device 100. The packaged device includes a semiconductor die 110. The semiconductor die 110 is mounted onto a die pad or die paddle 122, which forms part of a leadframe, generally referenced at 120, by means of epoxy 130. The leadframe 120 comprises the die pad 122, together with a plurality of bonding tabs 124, which act, on their top surface, as $2^{nd}$ bond pads for the wire bonds, and on their bottom surface as solder pads, arranged around the sides of the package 100. In the final packaged state, the die pad 122 of the leadframe 120 is electrically separated and isolated from each of the bonding tabs 124. Bond wires 140 connect the bonding tabs 124 to metal contact pads located on the top surface of the semiconductor die 110. The semiconductor die is encapsulated in an encapsulating material 150, such as an epoxy moulding compound (EMC) which seals the semiconductor die from the environment. In the final packaged device the bottom surface of the die pad 122 is exposed, as are the bottom surfaces of each of the bonding tabs 124. The side edges or surfaces of the bonding tabs 124 are also generally exposed. These exposed parts of the leadframe may then be soldered, in use, onto a PCB. The EMC generally fills the gaps between the die pad and the bonding tabs, such that the bottom surface of the package semiconductor device 100 is planar.

As mentioned in the introduction, for some applications it is important that the epoxy 130 can efficiently conduct heat away from the semiconductor die 110. For this, it is known to use so-called "high thermal" epoxy 130. An epoxy typically may be considered as a "high thermal" epoxy if it exhibits a thermal conductivity of at least 10 W/m·K. However, high thermal epoxy tends to suffer from weaker adhesion to the die pad at interface 135, and although this can be mitigated to some extent by roughening the surface of the die pad, that process adds to the total cost.

FIG. 2 shows a schematic cross-section through a package semiconductor device according to one or more embodiments of the present disclosure, in which the risk of delamination has been mitigated or avoided by providing a locking mechanism between the epoxy and the die pad. As in package semiconductor device shown in FIG. 1, the semiconductor device 200 includes a semiconductor die 110. The semiconductor die 110 is mounted onto a die pad or die paddle 222, which forms part of a leadframe, generally referenced at 220, by means of epoxy 130. The leadframe 220 comprises the die pad 222, together with a plurality of bonding tabs 124 arranged around the sides of the package 200. Bond wires 140 connect the bonding tabs 124 to metal contact pads (not shown) located on the top surface of the semiconductor die 110. The semiconductor die is encapsulated in an EMC 150, which seals the semiconductor die from the environment.

The die pad of the device in FIG. 2 has a patterned bottom surface. That is to say, there is at least one region in which the thickness of the die pad is reduced from a first thickness shown as t1, to a second thickness, shown as t2. The thickness t1 is the "full" or "conventional" thickness of a leadframe, which typically will be in the range of 100 to 300 µm, and may be 200 µm. The thickness of the reduced thickness region, is typically within a range between 25% and 75% of the full thickness, and more particularly may be in a range between 40% and 60% of, or be 50% of, t1—that is to say it may typically have half the thickness of the rest of the die pad. The shape or geometry of the one or more regions will be discussed in more detail hereinbelow with respect to FIG. 4; however, as shown in FIG. 2 it may include one or more trenches or fingers which extend across the semiconductor die, and may, as shown even extend beyond the width of the die. Within the at least one region of reduced thickness, the die pad has one or more, and typically several through-holes 226 therethrough. The through-holes extend completely through the die pad. The one or more regions of reduced thickness may be provided in the leadframe by any suitable means. For instance the skilled person will be familiar with appropriate processes such as selective etching in which part of the leadframe are first masked and then the exposed parts of the leadframe are chemical etched to reduce their thickness. Alternatively, the through-holes may be provided by selective etching, or by other techniques, such as stamping or drilling.

As shown in FIG. 2, the epoxy 130 which is used to bond the semiconductor die onto the die pad extends into the through-holes 226. The "die-attach" process is the same as the conventional process: epoxy is dispensed, typically using a dispensing pump to place a predefined volume of epoxy onto the central region of the leadframe die pad. The die is then applied into the die pad. According to the present disclosure, the pressure which is applied to assist surface tension in spreading the epoxy over the die pad, then also assists the surface tension to fill, and overfill, the through holes. The epoxy fills the through-holes, forming plugs, and extends beyond them towards the bottom of the device. That is to say, the epoxy forms plugs 232 which protrude out of the through-holes such that their lowermost surface 234 is below the lower surface of the reduced thickness part of the die pad. As shown, the lowermost surface 234 may be above the lower surface of the full thickness part of the die pad semiconductor in other embodiments the epoxy plugs through the through-hole may extend even further downwards beyond the lower surface of the full thickness part of the die pad. Not only do the epoxy plugs through the through-holes extend below the surface of the reduced thickness die pad, but below the die pad they also extend laterally beyond the through-holes as shown at head 228. That is to say, the lower part of the plug, below the through-hole, is wider than the through-hole itself. This creates a locking effect, in which the wider part of the epoxy has a similar effect as the head of a nail.

One way to achieve the plug having the wider head than the through-hole itself is to make use of surface tension: the material of the die pad is easily wetted by the epoxy, so once the epoxy flows through the through-hole and starts to exclude from the bottom, it will naturally spread out along the lower surface of the reduced thickness region of the die pad, under the influence of surface tension. The wettability of the epoxy to the walls of the through-holes and the bottom surface of the reduced thickness portion of the leadframe may be increased by a suitable pre-treatment, such as in particular by plasma cleaning of the leadframe, prior to the process of die attach.

Figure 4:
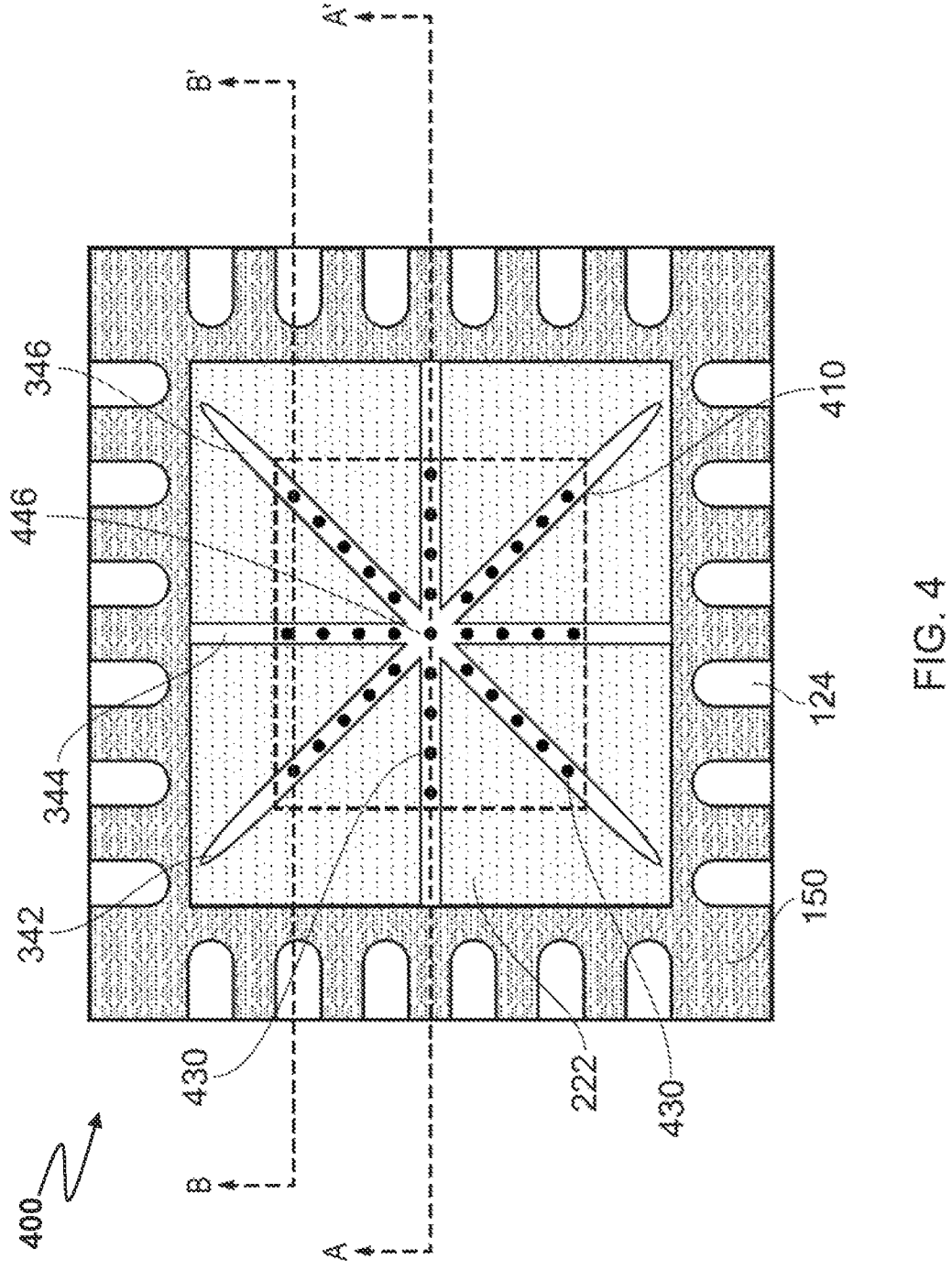
FIG. 4 shows a schematic rear view of a packaged semiconductor device according to the present disclosures.

Turing from the moment to FIG. 4: the reduced thickness region or regions of the die pad may have one of a variety of different geometrical shapes or patterns. One, nonlimiting, such pattern is illustrated in FIG. 4. The figure shows a rear side view of a package semiconductor device according to one or more embodiments of the present disclosure. The package 400 is a generally rectangular package and may typically, but not necessarily, be a QFN or QPN package. As can be seen in this rear view, the package includes encapsulant 150 which electrically isolates a plurality of bonding tabs 124 from a die pad 222. A semiconductor die is bonded by means of epoxy 130 (not shown) to the upper surface of the die pad. Since it is attached to the upper surface of the die pad, the semiconductor die is not visible in FIG. 4, but its outline is depicted by dashed line 410.

The die pad 222 has a region of reduced thickness. In this example, the region of reduced thickness is formed from a series of elongate fingers or trenches 342, 344, 346 which extend radially from a central hub 446, to form a star or snowflake pattern. Thus, in this example, the region is a single interconnected region. However, other configurations are possible. For example, there may be a plurality of separate regions of reduced thickness formed by a plurality of parallel trenches of fingers; in another nonlimiting example, there may be a grid of trenches of fingers at right angles to one another. Although, as indicated above for the series of parallel trenches, separate regions are possible, in general it is preferable that the regions are interconnected to form a single mesh in order to reduce the risk of forming an air pocket during later soldering of the packaged semiconductor device, for instance to a PCB. It will be appreciated that the region or regions of reduced thickness cover a relatively small fraction of the area of the die pad. Typically they cover no more than 25% or even no more than 10% of the surface area. 15% coverage is typical. The fraction of the surface area affected may be limited in order not to significantly reduce the strength die pad.

Also visible in FIG. 4 are a plurality of heads of plugs of epoxy 430. The plugs of epoxy fill through-holes in the reduced thickness region of the die pad; the through-holes are thus not visible or shown, but may be arranged along the trenches of fingers as can be seen from the location of the plugs. As discussed above, the heads of the plugs of epoxy 430 have a larger diameter than the through-holes themselves, due to the spreading of the epoxy, along the undersurface of the reduced thickness region of the die pad. Although not limited thereto, typically the through-holes are generally circular, and typically, they may have a diameter within a range between 15 and 150 μm, and preferably have a diameter within a range between 30 and 100 μm. The diameter, or more generically the "size" of the hole should preferably be sufficient to ensure that epoxy can flow through it under the combined influence of the die attach pressure and surface tension; conversely the hole should not be too large, lest epoxy falls through and drops out instead of forming a plug or nail with a head. As mentioned, the heads of the epoxy plugs, which extend beyond the diameter of the through-hole, again are generally circular, and may have a diameter which may lie within a range between 50 and 150 μm. In other embodiments, the spreading of the heads may be constrained by a trench or finger of reduced thickness such that the heads are elongate in a direction along a trench; generally the elongate heads will be having a length which is no more than about 200 μm.

Preferably, as shown in FIG. 4, the reduced thickness region of the die pad does not extend to its perimeter. This avoids the risk of the encapsulant moulding compound seeping into and along the trenches from the perimeter, during the moulding process.

Figure 3:
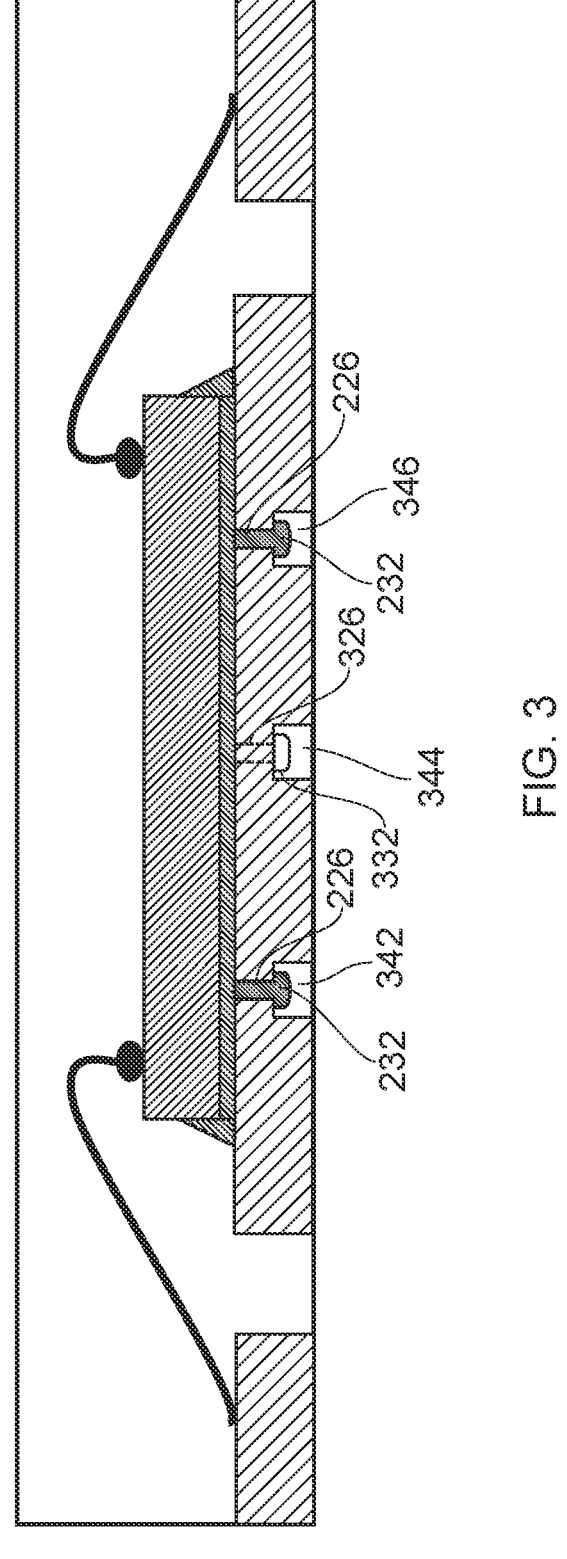
FIG. 3 shows a different cross-section through the packaged semiconductor device shown in FIG. 2.

It will be appreciated that FIG. 2 shows a cross-section of the packaged semiconductor device along section A . . . A' (although, for convenience, fewer through-holes 226 are shown in FIG. 2 than plugs 430 along that cross-section in FIG. 4). For completeness a further cross-section is shown in FIG. 3, this time through a section B . . . B'. FIG. 3 is generally similar to FIG. 2, except that in this cross-section, the entire length of a single trench of reduced thickness is not visible, but rather parts of three trenches 342, 344 and 346 are visible, the trenches begin part of the reduced thickness region of the die pad. Two plugs 232 are shown which fill through-holes 226 in trenches 342 and 346. However, in this cross-section, none of the through-holes in trench 344 are directly visible, so the hidden through-hole 326 is depicted by the dashed outline, and the view to the head 332 of the next plug in outline.

Figure 5:
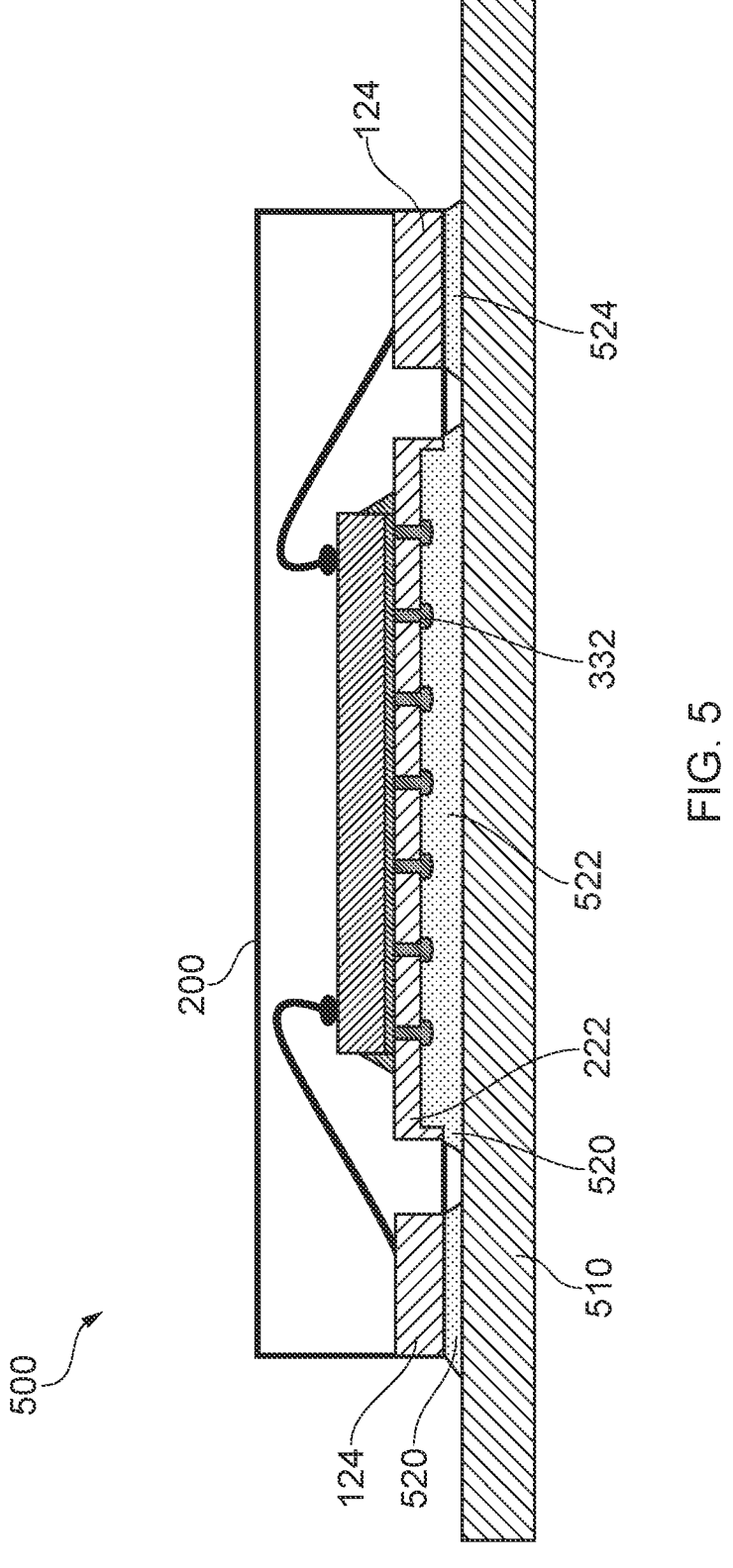
FIG. 5 shows a packaged semiconductor device mounted on a PCB.

Turning now to FIG. 5, this shows an assembly 500 of a package semiconductor device according to one or more embodiments, mounted onto a PCB 510 by means of solder 520, along the same cross-section as FIG. 2—this is to say, showing the whole length of one trench. As will be familiar to the skilled person, separate solder joints 524 connect the bonding tabs 124 to individual tracks (not shown) on the PCB 510. The die pad is soldered to the PCB by means of solder joint 522. As can be seen, in regions of the die pad having the full or first thickness, the solder joint has the same thickness as the joint to the bonding tabs 520. However, the solder flows into the recesses or trenches formed by the reduced thickness of the die pad in the reduced thickness region such that in this region the solder is thicker, so as not to leave a void. As shown, the solder thus comes into direct contact with the heads of the plugs 332 of epoxy.

Figure 6:
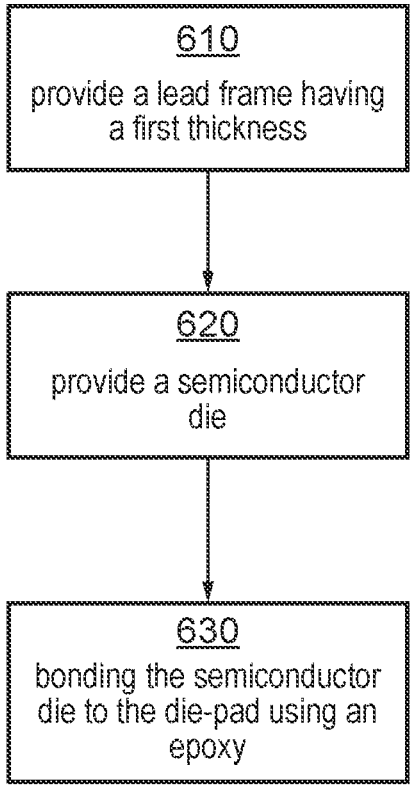
FIG. 6 shows a flowchart according to example methods of the present disclosure.

FIG. 6 shows a flowchart according to methods of manufacturing a packaged semiconductor device of the present disclosure. The method comprises, in a first step 610, providing a leadframe having a first thickness. The leadframe has a die pad, wherein in at least one region, the die pad has a second thickness less than the first thickness, and wherein the die pad has at least one through-hole in the at least one region. The method further comprises, in a second step 620, providing semiconductor die; and in a further step 630, bonding the semiconductor die to the die pad using an epoxy, such that the epoxy fills the at least one through-hole and extends thereunder and laterally beyond the through-hole.

From reading the present disclosure, other variations and modifications will be apparent to the skilled person. Such variations and modifications may involve equivalent and other features which are already known in the art of semiconductor device packaging and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

LIST OF SYMBOLS

100 Packaged Semiconductor device
110 Semiconductor Die
120 Leadframe
122 Die pad
124 Bonding Tab
130 Epoxy
135 Epoxy/die-pad interface
140 Bond wire
150 Encapsulating Material
200 Packaged Semiconductor Device
220 Leadframe
222 Die-pad
226 Through-hole
228 Head
232 Plug
234 Lowermost surface of plug
326 Outline of through-hole
332 Head
342 Trench
344 Trench
346 Trench
400 Packaged Semiconductor device
410 Semiconductor die outline
430 Head of plug
446 Hub
500 Assembly
510 PCB
520 Solder
522 Solder Joint
524 Solder Joint

The invention claimed is:

1. A packaged semiconductor device comprising:
a leadframe having a first thickness; the leadframe comprising a die pad;
a semiconductor die thereabove; and
epoxy therebetween and arranged to bond the semiconductor die to the die pad;
wherein in at least one region under the semiconductor die, the die pad has a second thickness less than the first thickness;
wherein the die pad has at least one through-hole in the at least one region; and
wherein the epoxy fills the at least one through-hole to form at least one plug that extends thereunder the at least one region and laterally beyond the through-hole.

2. The packaged semiconductor device of claim 1, wherein the epoxy has a thermal conductivity of at least 10 W/m·K.

3. The packaged semiconductor device of claim 2 wherein the second thickness is within a range of 40% to 60% of the first thickness.

4. The packaged semiconductor device of claim 1, wherein the at least one region extends laterally beyond the semiconductor die.

5. The packaged semiconductor device of claim 4 wherein the second thickness is within a range of 40% to 60% of the first thickness.

6. The packaged semiconductor device of claim 1, wherein the at least one region comprises a network of elongate channels.

7. The packaged semiconductor device of claim 6, wherein the network of elongate channels extends radially from a hub.

8. The packaged semiconductor device of claim 6, wherein the at least one region extends laterally beyond the semiconductor die.

9. The packaged semiconductor device of claim 1, wherein the leadframe further comprises a plurality of leads, electrically isolated from the die pad.

10. The packaged semiconductor device of claim 1, further comprising a moulding compound encapsulating the semiconductor die.

11. The packaged semiconductor device of claim 1 configured as a quad-flat-no-lead, QFN, package.

12. The packaged semiconductor device of claim 1 wherein the second thickness is within a range of 40% to 60% of the first thickness.

13. The packaged semiconductor device of claim 1 wherein the at least one through-hole includes a plurality of through-holes.

14. The packaged semiconductor device of claim 13 wherein the at least one plug includes a plurality of plugs, wherein each plug of the plurality of plugs includes a portion located in a through-hole of the plurality of through-holes.

15. The packaged semiconductor device of claim 1 wherein each plug of the at least one plug includes a first portion located in a through-hole of the at least one through-hole and a head portion that is located under the first portion, wherein the head portion is wider than the body portion.

16. The packaged semiconductor device of claim 15 wherein for each plug of the at least one plug, the head portion is wider than a diameter of a through-hole of the at least one through-hole that the first portion of the each plug is located in.

17. The packaged semiconductor device of claim 1 wherein:
a top surface of the at least one region of the die pad is coplanar with a top surface of other regions of the die pad;
a bottom surface of the at least one region of the die pad is located closer to the top surface of the at least one region than a bottom surface of the other regions of the die pad are located to the top surface of the other regions.

18. The packaged semiconductor device of claim 1, wherein:
the at least one region comprises a network of at least two elongate channels;
each elongate channel of the network includes at least one through-hole of the at least one through-hole where each through-hole includes a portion of a plug of the at least one plug.

19. An assembly including the packaged semiconductor device of claim 1, wherein the assembly further comprises:

a circuit board, wherein the packaged semiconductor devices is mounted on the circuit board;

solder located between the circuit board and the packaged semiconductor device, wherein the solder is in contact with the at least one plug.

20. The assembly of claim 19 wherein the solder is in contact with an underside surface of the at least one region.

* * * * *